United States Patent [19]
Ohannes et al.

[11] Patent Number: 5,184,034
[45] Date of Patent: Feb. 2, 1993

[54] STATE-DEPENDENT DISCHARGE PATH CIRCUIT

[75] Inventors: James R. Ohannes, Portland; Stephen W. Clukey, South Portland; Ernest D. Haacke, Westbrook; Roy L. Yarbrough, Hiram, all of Me.

[73] Assignee: National Semiconductor Corporation, Santa Clara, Calif.

[21] Appl. No.: 804,906

[22] Filed: Dec. 6, 1991

[51] Int. Cl.[5] .............. H03K 19/013; H03K 19/0952
[52] U.S. Cl. .................................... 307/473; 307/446; 307/570; 307/300
[58] Field of Search ................ 307/299.1, 299.2, 300, 307/456, 443, 446, 473, 475, 570

[56] References Cited

U.S. PATENT DOCUMENTS

| | | | |
|---|---|---|---|
| 4,678,943 | 7/1987 | Uragami et al. | 307/570 |
| 4,999,519 | 3/1991 | Kitsukawa et al. | 307/446 |
| 5,047,669 | 9/1991 | Iwamura et al. | 307/473 |
| 5,059,824 | 10/1991 | Ueno | 307/570 |
| 5,107,143 | 4/1992 | Veno et al. | 307/446 |

Primary Examiner—Edward P. Westin
Assistant Examiner—Benjamin D. Driscoll
Attorney, Agent, or Firm—Thomas L. Bohan; Daniel H. Kane, Jr.; James W. Rose

[57] ABSTRACT

A circuit for use in connection with tristate output buffers in order to provide concurrently for fast discharge of the output pulldown transistor base and at the same time for building in protection against reverse breakdown in the pulldown transistor. The innovation consists of providing a two discharge paths to ground for the base of the output pullup transistor. A low-capacitance path is activated only while the output buffer is in its active mode. In the preferred embodiment of the invention, this low discharge path consists of two CMOS transistors in series, one of which is controlled by the enable signal input E of the buffer circuit and the other by the data signal input $V_{IN}$ of the buffer circuit. The other path to ground is available whenever the data signal input $V_{IN}$ is low, regardless of whether the buffer is in its active or inactive mode. This other path provides discharge protection for the base of the pullup transistor for the buffer in its inactive mode, and has incorporated into it reverse breakdown protection in the form of voltage drop devices such as forward-biased diodes.

10 Claims, 2 Drawing Sheets

STATE-DEPENDENT DISCHARGE PATH CIRCUIT

CROSS-REFERENCE TO RELATED PATENT APPLICATIONS

This invention is related to the James R. Ohannes, Stephen W. Clukey, E. David Haacke, Roy L. Yarbrough, Susan M. Keown, and Michael G. Ward U.S. patent application Ser. No. 07/804,105 filed concurrently for BiCMOS OUTPUT BUFFER CIRCUIT WITH CMOS DATA PATHS & BIPOLAR CURRENT APPLICATION, and to other U.S. Patent Applications there referenced. In its preferred embodiment, the present invention is an improvement on the basic BiCMOS output buffer circuit described in the above-referenced U.S. Patent Application.

BACKGROUND OF THE INVENTION

1. Field of the Invention

The technical field of this invention lies with tristate output buffer circuits utilized to coupled a multiplicity of logic circuits to a common bus. More particularly, this invention is related to providing pullup transistor breakdown protection for a buffer in its inactive mode without compromising high-to-low output transition times for the same buffer in its active mode. More particularly yet, this invention provides two different paths for discharging the base node of the output pullup transistor of said buffer circuit such that the operative discharge path for the buffer's high Z (inactive mode) provides extra protection against reverse breakdown of said output pullup transistor while the operative discharge path of said buffer in its active state is free of extraneous capacitance which would slow H→L output switching.

In its preferred embodiment, the State-Dependent Discharge Path Circuit of the present invention is incorporated into tristate BiCMOS circuits and is comprised of CMOS transistors serving to protect and enhance the operation of bipolar output pullup transistors. More particularly, the preferred embodiment comprises an improvement to the BiCMOS output buffer circuit described in the related patent application identified above and described below. Such output buffer circuits incorporate the low power requirements, high input impedance, and high speed advantages of MOSFET transistors such an NMOS and PMOS transistors along with the high current amplification and low output impedance advantages of bipolar transistors such an NPN transistors.

2. Description of Related Art

A non-inverting BiCMOS output buffer circuit according to the related patent application identified above is illustrated in FIG. 1. This is a tristate buffer, with the enable circuit having complementary enable signal inputs E and EB. Enable signal input E is coupled to a CMOS pullup enable stage Q16,Q13 and complementary enable signal input EB is coupled to a CMOS pulldown enable stage Q12,Q9. The pullup enable stage Q16,Q13 is coupled in a NAND gate with a pullup-predriver-input-inverter-stage Q15,Q14; the pulldown enable stage Q12,Q9 is coupled in a NOR gate with a pulldown-predriver-input-inverter stage Q11,Q10. As will be discussed subsequently, biasing enable input E with a logic high signal (and the complementary input EB with a logic low signal) places the output buffer in its bistate active mode controlled by $V_{IN}$. Conversely, biasing E low and EB high places the output buffer in its inactive mode (the high Z state) and not subject to $V_{IN}$. The discussion immediately following of the circuit depicted in FIG. 1 assumes that the complementary enabling inputs E, EB are biased so as to place the buffer in its active mode. In that mode, transistors Q16 and Q9 are non-conducting and transistors Q13 and Q12 are conducting.

In its active mode, the BiCMOS output buffer circuit delivers output signals of high and low potential levels H, L at the output $V_{OUT}$ in response to data signals at the input $V_{IN}$. Specifically, a logic high input at $V_{IN}$, after passing through a double inversion predriver circuit comprised of CMOS transistors, triggers a Darlington bipolar output pullup transistor pair Q24, Q22 so as to source current from the high potential output supply rail $V_{CCN}$ through resistor R6 and diode D1 coupled to the collector node of bipolar output pullup transistor Q22 to the output $V_{OUT}$. Similarly, a logic low input at $V_{IN}$, after passing through the inverting predriver circuit Q11,Q10 turns on high current capacity output pulldown transistor pair Q44A,Q44B, so that they sink current from the output $V_{OUT}$ to the low potential output ground rail GNDN.

More precisely and with continuing reference to FIG. 1, the input $V_{IN}$ is coupled directly to a CMOS pullup-driver-circuit comprising pullup-predriver-input-inverter-stage Q15,Q14 and, through intermediate node n1, to a pullup-driver-inverter-stage Q21A,Q20. This second inverter stage Q21,Q20 is coupled to the base nodes of bipolar output pullup transistors Q24,Q22. A logic high data signal H at the input $V_{IN}$ thus causes the pullup-driver-inverter-stage PMOS transistor Q21A to provide base drive current to bipolar transistor Q24. Bipolar transistor Q24, coupled via its collector node to the output supply rail $V_{CCN}$ through Schottky diode SD1 and resistor R5, in turn sources amplified base drive current to bipolar output pullup transistor Q22.

In contrast, a logic low data signal L at the input $V_{IN}$, causes the pullup-driver-inverter-stage NMOS transistor Q20 to couple the base of bipolar output pullup transistor Q24 directly to GNDQ and the base of bipolar output pullup transistor Q22 to GNDQ through the forward-biased Schottky diode pair SD11,SD12 in series-thus turning off both pullup transistors.

With continuing reference to FIG. 1, $V_{in}$ is also coupled to a CMOS pull-down-predriver-input-inverter stage Q11,Q10 and, through intermediary node n2, to a control gate node of pulldown driver transistor Q60, an NMOS transistor. Transistor Q60 is coupled to the base node of the bipolar output-pulldown-transistor Q44, actually a pair of high-current-capacity transistors Q44B,Q44A. The pulldown driver transistor Q60 source is coupled to the high potential power rail $V_{CCQ}$ through diode SD3 and resistor R4 so that when it is conducting, is sources drive current to the base node of bipolar output pulldown transistor Q44. Transistor Q60 is an effective "phase splitter," operating bipolar output pulldown transistor Q44 out of phase with bipolar output pullup transistor Q22.

The pulldown driver stage also includes a "Miller Killer" (MK) transistor Q9A coupled for sinking parasitic Miller capacitance current from the base node of bipolar pulldown transistor Q44 to the output ground GNDN. An MK predriver stage Q40,Q41 is coupled between the common node n2 of the pulldown predriver input stage Q11,Q10 and the control gate node of the MK transistor Q9A. The small-current-conducting MK transistor Q9A and the two MK predriver stage transistors Q40,Q41 are all constructed with small channel widths so as to enhance switching speed. The operation of MK transistor Q9A is sufficiently fast that it operates as an AC Miller Killer (ACMK) during H to L transitions at the output $V_{out}$ as well as a DC Miller Killer (DCMK) transistor during steady-state high Z operation, guarding against Miller Current effects when the output $V_{out}$ is forced high by events occurring elsewhere on the common bus.

An accelerating feedback diode SD4 is coupled between the output $V_{out}$ and the drain node of pulldown driver transistor Q60. Discharge current from the output $V_{out}$ is therefore fed back through the primary current path of this NMOS pulldown driver transistor Q60 in order to accelerate turn-on of the bipolar output pulldown transistor pair Q44 during a H→L output transition.

The previous discussion assumed that enable inputs E and EB were biased so as to maintain the buffer in its active bistate, under the control of $V_{IN}$. That required a logic high signal at E and the complementary logic low at EB. Conversely, if E is given a logic low signal, transistor Q16 will become conducting. When that happens transistor Q21A will have a logic high bias at its control gate and hence will be incapable of providing base drive to pullup transistor Q24 regardless of whether transistor Q15 is on or off. Thus, with E low, there will be no current-sourcing regardless of the signal applied to the input $V_{IN}$. Similarly, the complementary logic high signal at EB will maintain transistor Q12 off and transistor Q9 on. This means that transistor Q60 will remain off regardless of whether transistor Q11 is conducting. With Q60 off, there will be no base drive for pulldown (current-sinking) transistor Q44. Hence, with EB high, there will be no current sinking regardless of the signal applied to the input $V_{IN}$. Therefore, with E low, EB high, both the output pullup transistor Q22 and the twin output pulldown transistor Q44 will appear to the common bus as simply high dc impedances isolating the common bus connection at $V_{OUT}$ from both the high potential power rail $V_{CCN}$ and the low potential power rail GNDN. This is what constitutes the inactive mode—also known as the high Z state, the third state, or the "tristate"—of the tristate output buffer.

Normally, all but one of the output buffer circuits coupled to the common bus will be inactive at any instant. Nevertheless, the inactive buffers will still be exposed to the fluctuating potential of the bus through the coupling at $V_{OUT}$, and—as indicated above—each inactive buffer will have its output forced high and low by the bus. If precautions are not taken, it is possible for a high voltage appearing at $V_{OUT}$ to cause reverse breakdown of the emitter-base junction of transistor Q22 and a coupling of the bus to ground through the conducting transistor Q20, with severe bus loading as the consequence. Placing the Schottky diode pair SN11,SD12 in series with the link coupling the base of Q22 to GNDQ boosts the total voltage required for Q22 breakdown by twice the amount of the forward drop of a conducting Schottky diode. Given the voltage required for reverse breakdown in Q22 and the maximum anticipated voltage to which $V_{OUT}$ will be forced by the bus, this increment is enough to ensure that such reverse breakdown will not occur.

Although the related invention described above and depicted in FIG. 1 meets high switching time and breakdown specifications, it is slowed somewhat in its H→L output switching due to the Schottky diode pair SD11,SD12 added as breakdown protection to the base discharge path of pullup transistor Q22. The capacitance of these diodes provides charge storage which delays the pulling of the output pullup transistor base needed to switch that transistor from conducting to non-conducting. This not only increases the time needed to effect the output transition of the buffer from a current-sourcing (H) to a current-sinking (L) state, but can result in the pullup transistor continuing to source current even after the pulldown transistor has begun to sink current-a simultaneous conduction leading to "crowbar current" losses. Stated differently, the cost of the breakdown protection provided by SD11,SD12 is an increased high-to-low propagation time $tp_{HL}$.

What is needed, therefore, is a circuit which, while providing breakdown protection for a inactive tristate buffer with its output forced high, will do so without compromising the H→L switching time of the buffer in its active state.

SUMMARY OF THE INVENTION

The present invention provides an alternate low-capacitance base discharge path for the pullup transistor of a tristate output buffer, a discharge path which is only available when the buffer is in its active mode. By this expedient, it permits adequate breakdown protection to be built into the inactive-mode discharge path provided the pullup transistor base without concern about compromising the buffer's performance in its active mode.

The problem addressed by the present invention arises from the necessity to always have an affirmative discharge path available to the output pullup transistor base—even when the buffer is in its inactive mode—so as to ensure that the pullup transistor does not become current sinking due to unwanted voltages applied to its base node by whatever cause. Unfortunately, this affirmative discharge presents the potential for serious bus loading when the buffer is in its active mode. This is because the inactive buffer's output node (normally coupled directly to the pullup transistor emitter) can be forced by the common bus to voltages sufficient to cause reverse breakdown of the base/emitter junction of the pullup transistor. If the base is tied directly to ground (or, in general, the low potential power rail of the buffer), then current can flow from the bus to ground through the reverse-biased emitter/base junction whenever the bus forces the buffer output high. In order to avert this bus-loading phenomenon, voltage-drop devices—most commonly, one or more diodes—are placed in series in the discharge path. These diodes are connected so as to be forward-biased by base-drive voltages at the pullup transistor. Thus, where the pullup transistor is an npn transistor, these diodes are forward-biased by a pulldown base voltage positive with respect to the low potential power rail. This discharge path is controlled by a discharge transistor which conducts to the low potential power rail when the buffer is in a logic low output state or when the buffer is in its high Z inactive state. Unfortunately, the voltage-drop devices tend to slow the discharge excessively when the active buffer is undergoing a H→L transition, at which point pullup transistor switching speed is critical. Failure of the pullup transistor to switch fast enough can result in a transient where current is sourced while the pulldown transistor is conducting, so that the current passes directly from the high potential power rail to the low potential power rail through the pullup and pulldown transistors of a single buffer.

The present invention provides a low capacitance shunt to the low potential power rail, i.e., a parallel discharge path to the one containing the voltage-drop diodes. For definitiveness, this invention will be discussed in terms of its embodiments in which there is nothing in the shunt path but two transistors in series. In this example, one of the transistors—the "discharge enable transistor"—is coupled to the associated tristate buffer's enable input in such a way that it is conducting if and only if the buffer is placed in its active mode. The other transistor—the "discharge transistor"—in the alternate discharge path is coupled to the data input of the buffer in such a way that when a logic low data signal is applied at that input the discharge transistor is made conducting (and will conduct if the discharge enable transistor is also turned on). Because of the alternate path's low impedance, essentially all of the discharge current from the pullup transistor base will flow along it rather than the still-connected parallel path containing the diodes, and thus the switching speed of the pullup transistor will no longer be a limiting factor in H→L transitions of the buffer in its active mode.

If the discharge enable transistor is turned off or if the discharge transistor is turned off, this alternate discharge path constitutes a high-impedance path between the pullup transistor base and the low potential power rail and hence poses no breakdown threat to the pullup transistor in the buffer's inactive mode. Any discharge from the base of the pullup transistor will now have to follow the path having the Schottky diodes in series. Although, as stated, it is important to have a discharge path available to the base of the pullup transistor even when the buffer is inactive, there is not such a premium on speed as there is when the active buffer is making an output transition.

PREFERRED EMBODIMENT OF THE INVENTION

Figure 1:
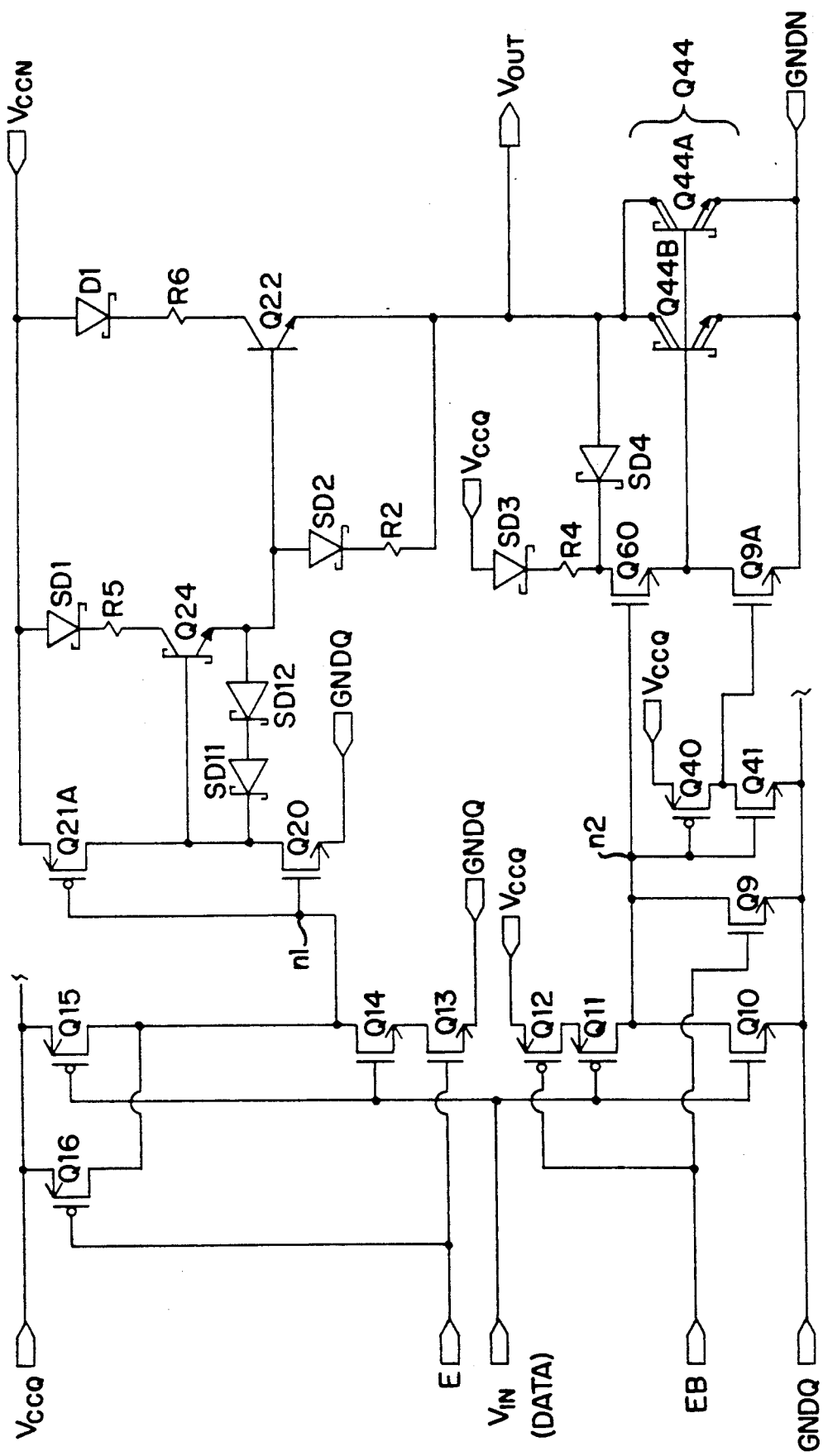
FIG. 1 is a depiction of a related-art BiCMOS tristate output buffer circuit which is the subject of a concurrent U.S. Patent application.
Figure 2:
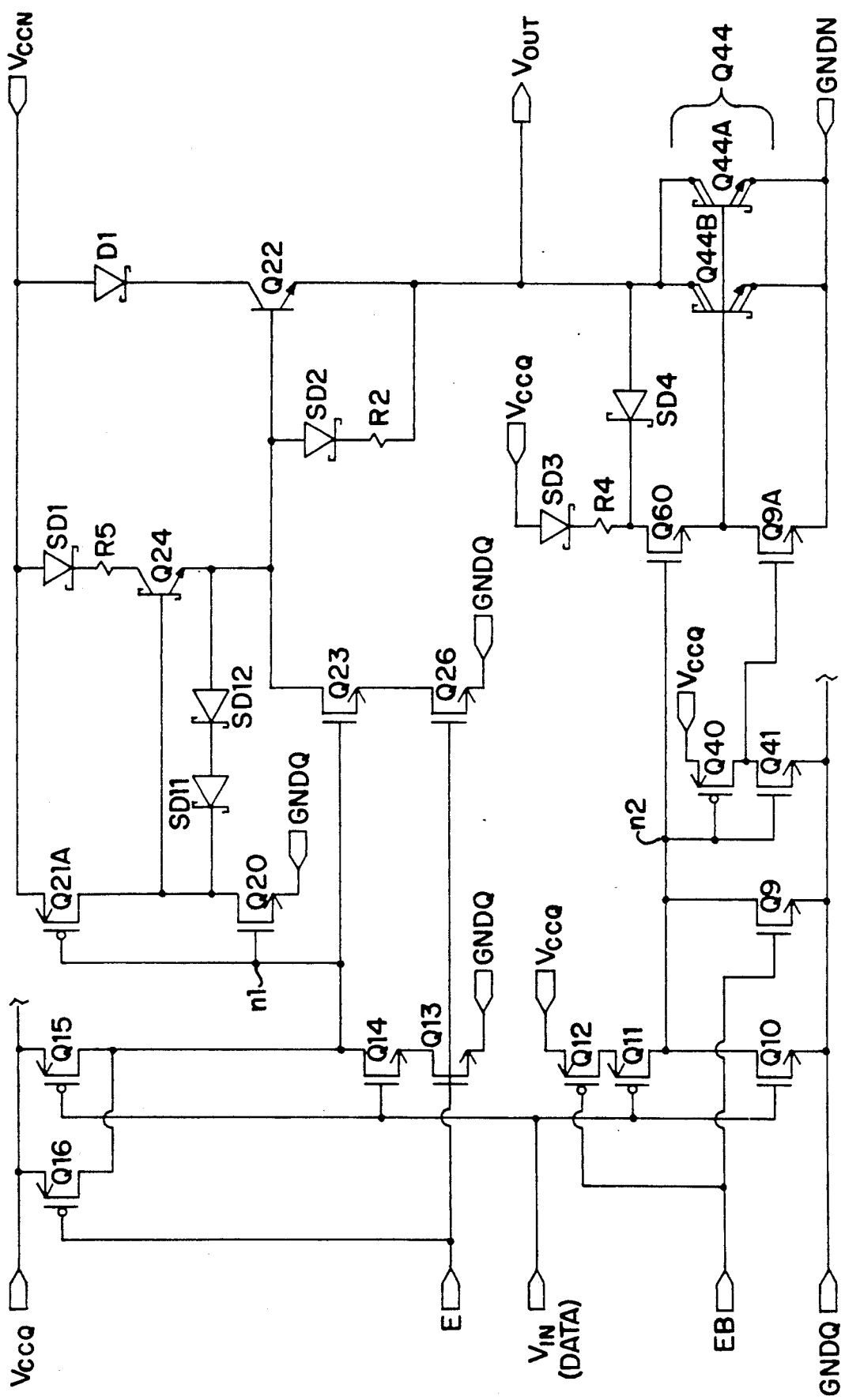
FIG. 2 is a depiction of the BiCMOS tristate output buffer circuit of FIG. 1 with the preferred embodiment of the present invention incorporated.

In its preferred embodiment the present invention comprises NMOS transistors and serves as a high-speed discharge path in a BiCMOS output buffer circuit shown in FIG. 2. In particular, said preferred embodiment provides an alternate path from a base node of a bipolar pullup transistor Q22 to a low potential ground rail GNDQ of said buffer. Said alternate path comprises a discharge transistor Q23 in series with a discharge enable transistor Q26, wherein said discharge transistor Q23 is coupled between said base node of said pullup transistor Q22 and said discharge enable transistor Q26, which is coupled directly to said low potential ground rail GNDQ. In said preferred embodiment both said discharge enable transistor Q26 and said discharge transistor Q23 are NMOS transistors.

Said BiCMOS output buffer circuit comprises a data input $V_{IN}$, an enable signal input E, and a complementary enable signal input EB. Said buffer also comprises a CMOS pullup-predriver-inverter stage comprising a PMOS transistor Q15 and an NMOS transistor Q14 and a CMOS pullup-enable stage comprising PMOS transistor Q16—coupled in parallel with said PMOS transistor Q15—and an NMOS transistor Q13 coupled to said low potential power rail GNDQ in series with said NMOS transistor Q14. A control gate node of said discharge transistor Q23 is coupled in parallel to drain of said PMOS transistor Q16 and a drain of said PMOS transistor Q15. A control gate node of said discharge enable transistor Q26 is coupled directly to said enable signal input E.

When said discharge transistor Q23 and said discharge enable transistor Q26 are both conducting, said base node of said pullup transistor Q22 is coupled directly to said low potential ground rail GNDQ, thus ensuring that current-sourcing stops and remains stopped. Said discharge enable transistor Q26 is conducting if and only if a logic high signal is input at said enable signal input E. With said discharge enable transistor Q26 conducting, coupling of said base of said pullup transistor Q22 to said low potential power rail GNDQ through said alternate path is controlled by said discharge transistor Q23; i.e., said base of said pullup transistor Q22 is then coupled to said low potential power rail if and only if said discharge transistor Q23 is conducting. Said discharge transistor Q23 is conducting when said PMOS transistor Q15 is conducting, that is, if and only if a logic low signal is input at said data input $V_{IN}$. Thus, when said BiCMOS tristate output buffer is in an active mode, said base of said pullup transistor Q22 is affirmatively discharged to said low potential power rail through said alternate path if and only if $V_{IN}$ is low.

A first discharge path also exists for said pullup transistor Q22 in said BiCMOS tristate output buffer. That path couples said base node of said pullup transistor Q22 to said low potential power rail GNDQ through two Schottky diodes SD11 and SD12 and a controlling transistor Q20. A control gate node of said controlling transistor Q20 is coupled in common with said control gate node of said discharge transistor Q23 and is made conducting if and only if said discharge transistor Q23 is made conducting. Thus, for said BiCMOS tristate buffer in its active mode, both said first discharge path and said alternate path are available for discharge said base node of said pullup transistor Q22. Nevertheless, because of the presence of said Schottky diodes SD11 and SD12 in said first discharge path, said alternate path will dominate for said discharge of said pullup transistor Q22. Because of low capacitive impedance in said alternate discharge path said pullup transistor Q22 will turn off extremely rapidly upon a H→L switch at said input $V_{IN}$.

We claim:

1. A state-dependent-discharge-path circuit for discharging a control node of an output pullup transistor of a tristate output buffer, where said tristate output buffer comprises a data signal input and an enable signal input, wherein said data signal input is coupled to a pullup-predriver-inverter-stage, wherein said state-dependent discharge path comprises a first ground link and a second ground link wherein first ground link is coupled between said control node and a low potential power rail and comprises (a) a first discharge transistor controlled by output of said pullup-predriver-inverter-stage and coupled in series with (b) a breakdown-protection-voltage-drop device, and wherein said second ground link is coupled between said base node and ground and comprises (a) a second discharge transistor controlled by output of said pullup predriver inverter stage and coupled in series with (b) a discharge enable transistor which is controlled directly by said enable signal input.

2. A state-dependent-discharge-path circuit as described in claim 1 wherein said output pullup transistor is a bipolar transistor and said control node is a base node of said bipolar transistor.

3. A state-dependent-discharge-path circuit as described in claim 2 wherein said first discharge transistor, said second discharge transistor, and said discharge enable transistor are all field effect transistors.

4. A state-dependent-discharge-path circuit as described in claim 3 wherein said first discharge transistor, said second discharge transistor, and said discharge enable transistor are all NMOS transistors.

5. A state-dependent-discharge-path circuit as described in claim 4 wherein said breakdown protection voltage drop device comprises one or more diodes.

6. A state-dependent-discharge-path circuit as described in claim 5 wherein said tristate output buffer is a BiCMOS device comprising CMOS transistor stages in its data paths and bipolar output pullup transistors and bipolar output pulldown transistors.

7. A state-dependent-discharge-path circuit as described in claim 6 wherein said low potential power rail comprises a quiet ground line partially isolated from said bipolar output transistors and bipolar output pulldown transistors.

8. A BiCMOS tristate output buffer circuit having an active mode of operation for delivering output signals of high and low potential levels at an output $V_{OUT}$ in response to data signals at a data signal input $V_{IN}$ and an inactive mode of operation providing a high impedance third state at said output $V_{OUT}$, comprising a bipolar output pullup transistor Q22 for sourcing current to said output $V_{OUT}$ from a high potential power rail $V_{CCN}$, a CMOS pullup predriver circuit coupled to said pullup transistor Q22, a base node of said pullup transistor Q22 coupled to a quiet low potential power rail GNDQ through a first discharge path in parallel with a second discharge path, wherein said first discharge path comprises breakdown-protection-voltage-drop device and said second discharge path constitutes a low-capacitance circuit lacking said voltage-drop device, wherein said second discharge path comprises (a) a discharge transistor Q23 with primary current path between said base node of said pullup transistor Q22 and (b) a discharge enable transistor Q26 with primary current path between said discharge transistor Q23 and said low potential power rail GNDQ, (c) discharge turnon means for ensuring that said discharge transistor Q23 is conducting only if a low potential signal is applied to said input $V_{IN}$, and (d) discharge enabling means for ensuring that said discharge enable transistor Q26 is conducting if and only if said BiCMOS tristate output buffer circuit is in its active mode of operation.

9. The tristate BiCMOS output buffer circuit claimed in claim 8, wherein said tristate output buffer circuit also comprises (a) an enable input E and buffer-enabling circuitry for placing said tristate output buffer circuit in said active mode by application of a logic high enabling signal to said enable input E and for placing said tristate output buffer circuit in said inactive mode by application of a logic low disabling signal to said enable input E, and (b) a pullup-predriver-first-inverter-stage coupled between said input $V_{IN}$ and a pullup-driver-second-inverter stage, wherein said discharge transistor Q23 and said discharge enabling transistor Q26 are both NMOS transistors, wherein said discharge enabling means comprises a direct coupling between said enable signal input E and a control gate of said discharge enabling transistor Q26 and wherein said discharge means comprises a coupling of said discharge transistor Q23 to said input $V_{IN}$ through said pullup-predriver-first-inverter-stage.

10. The BiCMOS tristate output buffer circuit of claim 9 wherein said pullup-predriver-first-inverter-stage comprises a complementary CMOS pair comprised of P-channel transistor Q15 and N-channel transistor Q14 with control gates of said transistor Q15 and said transistor Q14 connected in common to said input $V_{IN}$ and an output of said pullup-predriver-first-inverter-stage coupled directly to an input of a pullup-driver-second-inverter-stage comprising a complementary CMOS pair comprised of P-channel transistor Q21A and N-channel transistor Q20, wherein an output of said pullup-driver-second-inverter-stage is coupled to a base of a bipolar first pullup transistor Q24, the principal path of current of said first pullup transistor Q24 being between said high potential rail $V_{CCN}$ and a base of a bipolar output pullup transistor Q22, and wherein said output of said pullup-predriver-first-inverter-stage is also coupled directly to said control gate of said discharge transistor Q23.

* * * * *